United States Patent
Luebke et al.

(10) Patent No.: US 6,844,819 B2
(45) Date of Patent: Jan. 18, 2005

(54) VOLTAGE SENSING HAND TOOL

(75) Inventors: Thomas M. Luebke, Menomonee Falls, WI (US); David L. Wiesemann, Pewaukee, WI (US); George R. Steber, Mequon, WI (US)

(73) Assignee: Actuant Corporation, Glendale, WI (US)

( * ) Notice: Subject to any disclaimer, the term of this patent is extended or adjusted under 35 U.S.C. 154(b) by 0 days.

(21) Appl. No.: 10/808,291

(22) Filed: Mar. 24, 2004

(65) Prior Publication Data

US 2004/0183689 A1 Sep. 23, 2004

Related U.S. Application Data

(63) Continuation of application No. 10/112,446, filed on Mar. 28, 2002, now Pat. No. 6,731,218.

(51) Int. Cl.[7] .............................................. G08B 21/00
(52) U.S. Cl. ....................... 340/660; 340/661; 340/662; 340/654
(58) Field of Search .............................. 340/660, 661, 340/662, 663, 664, 653, 654; 324/76.11, 149

(56) References Cited

U.S. PATENT DOCUMENTS

| | | | |
|---|---|---|---|
| 4,716,371 A | * | 12/1987 | Blitshteyn et al. .......... 324/457 |
| 4,724,382 A | | 2/1988 | Schauerte |
| 5,103,165 A | | 4/1992 | Sirattz |
| 5,363,045 A | | 11/1994 | Martin et al. |
| 5,877,618 A | | 3/1999 | Luebke et al. |
| 6,100,679 A | | 8/2000 | McCasland |
| 6,118,270 A | | 9/2000 | Singer et al. |
| 6,278,952 B1 | * | 8/2001 | Swain ........................ 702/64 |
| 6,424,139 B2 | | 7/2002 | Bystrom et al. |

OTHER PUBLICATIONS

Applicant's Exhibit A: 1997 Gardner Bender Catalog pages showing Circuit Tesler and Screwdriver and Circuit Alert Non–Contact Voltage Tester.

* cited by examiner

Primary Examiner—Toan N. Pham
(74) Attorney, Agent, or Firm—Quarles & Brady LLP

(57) ABSTRACT

A hand tool which provides an alarm signal to a user as the tool approaches a live electrical wire is disclosed. The hand tool comprises a conductive tool head and a non-conductive handle. A non-contact voltage sensing circuit is provided in the handle of the tool. As the tool head approaches a live electrical wire, the non-contact voltage sensing circuit detects the voltage across the air gap between the tool head and the electrical wire, triggering an alarm circuit. The alarm circuit provides a visual or audio signal to the user.

12 Claims, 8 Drawing Sheets

US 6,844,819 B2

VOLTAGE SENSING HAND TOOL

CROSS-REFERENCE TO RELATED APPLICATION

This application is a continuation of U.S. application Ser. No. 10/112,446 filed Mar. 28, 2002 now U.S. Pat. No. 6,731,218 herein incorporated by reference.

FIELD OF INVENTION

The present invention is generally directed to an electrical sensing tool More particularly, the present invention is directed to a voltage sensing hand tool which includes a non-contact voltage sensing circuit and an associated alarm circuit.

BACKGROUND

Electricians, technicians, maintenance people and others who work with and around electrical distribution and wiring systems often work in the vicinity of energized electrical panels and wires. Good practice dictates that these electrical circuits be de-energized when work is performed. Not infrequently, however, through error or oversight, these circuits remain in an energized condition during maintenance, thereby presenting an electrical hazard to both the worker and to the associated electrical equipment.

One particular hazard is encountered when conductive hand tools such as wire strippers, cutters, pliers, screwdrivers and such are employed in maintenance procedures. When these hand tools come into contact with the live electrical circuits, they can cause both injury to the worker and damage to the electrical equipment.

Due to these problems, hand held tools that include a voltage meter embedded in the handle have been developed. The voltage meter provides an indication to the user that a voltage is present on the wire and that, therefore, a live wire has been contacted. Such devices, however, require actual, physical contact with the live wire or circuit before the user is alerted. These are useful when the user is probing for a live wire. These devices do not provide a sufficient warning to an unsuspecting user contacting a high voltage circuit to prevent injury or damage. Furthermore, these devices do not provide any indication of contact with a live wire when the wire is insulated.

Also available in the art are non-contact voltage indicators, also useful to probe for a live wire. These indicators provide a visual or audio indicator to the user when the indicator is placed in the vicinity of an AC voltage. An example of a device of this type is shown, for example, in U.S. Pat. No. 5,877,618 "Hand Held Non-Contact Voltage Tester". While useful in providing an indication of a live wire, successful use of this device requires the user to test the wire before work is begun. The test, therefore, does not solve the initial problem: erroneously or mistakenly forgetting to disable or verify disablement of the circuit before work is begun.

Neither of these prior art devices therefore can actively alert the user of the possibility of hazardous voltages on the wires, cables or other electrical devices prior to potentially dangerous contact.

Thus there remains a need for a hand tool that intrinsically alerts a user when the tool is placed in the vicinity of a wire or cable that has a hazardous voltage impressed on it.

SUMMARY OF THE INVENTION

The present invention is a low cost, reliable and easy-to-use hand tool providing an alert signal to a user prior to contacting a live wire. The device of the present invention integrates a non-contact voltage alert circuit and associated alarm circuitry into a hand tool, thereby providing a high degree of safety for the user. The alarm circuitry provides a visual or audio signal, alerting the user that contact with a live wire is about to be made.

In one aspect of the invention, a hand tool is provided comprising a conductive tool head that is at least one of a wire cutter, a wire stripper, a screw driver, a wrench, and a pliers, a non-contact voltage sensing circuit electrically connected to the conductive tool head, and a handle operatively connected to the tool head and housing the non-contact voltage sensing circuit including the at least one indicator. The non-contact voltage sensing circuit includes a comparator for comparing a voltage sensed at the conductive tool head to a threshold voltage level and an alarm circuit for generating a human perceptible alarm signal when the threshold voltage level is exceeded. The alarm circuit includes at least one of a visual and an audio indicator device electrically connected to receive the alarm signal and to provide an output that is perceptible by a human indicating that the tool head is in proximity to a live electrical wire.

In another aspect, the invention provides a hand tool comprising a conductive tool head that is at least one of a wire cutter, a wire stripper, a screw driver, a wrench and a pliers to work a work piece, a handle, connected to the tool head so as to operate the tool head to work the work piece, and a non-contact voltage sensing circuit electrically coupled to the conductive tool head. An alarm device activated by the non-contact voltage sensing circuit provides a signal to indicate that the tool head is in an electrical field at an elevated voltage.

Other features of the invention and advantages will become apparent upon reading the material provided hereafter.

DESCRIPTION OF THE EMBODIMENTS

Figure 1:
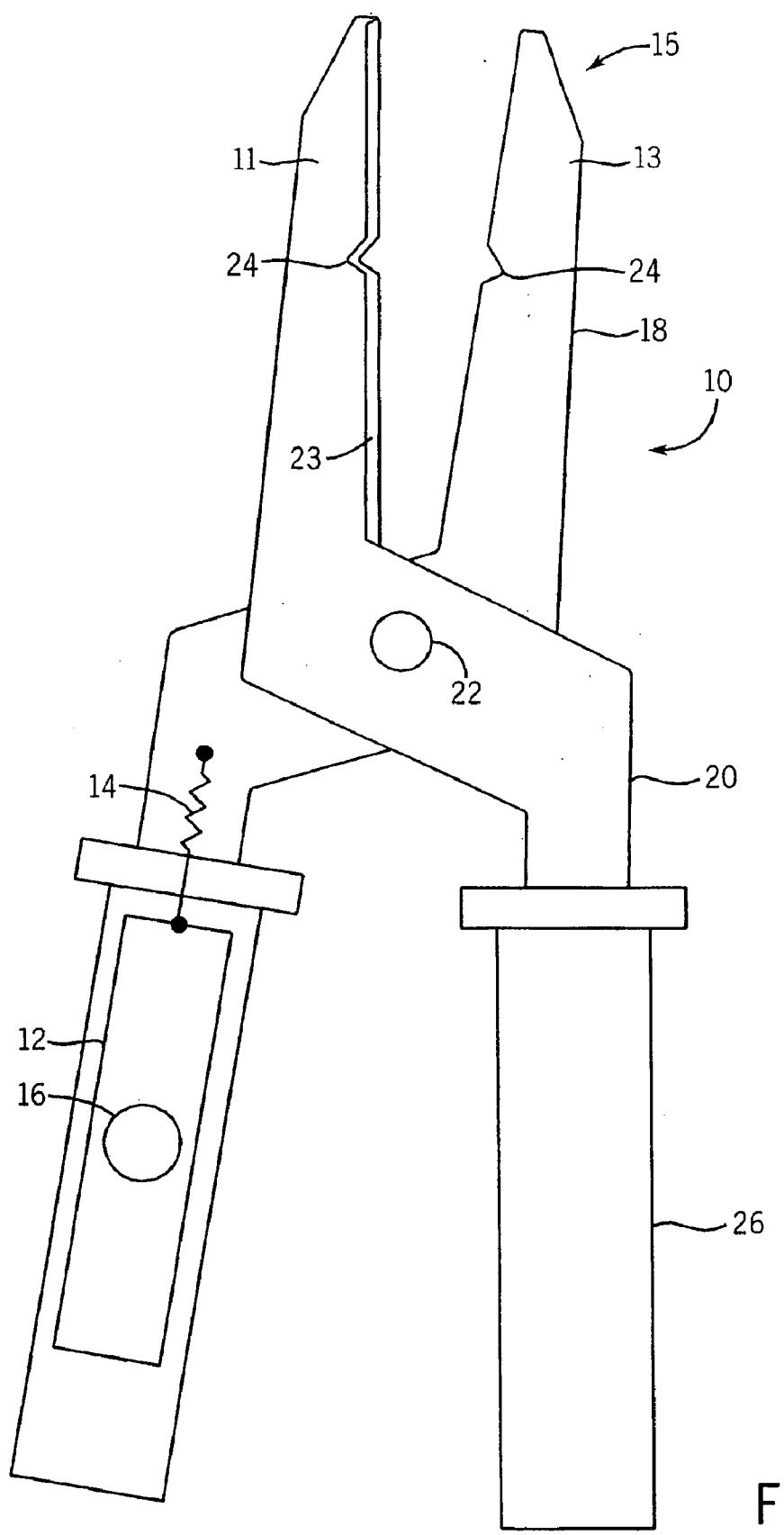
FIG. 1 is a schematic plan view of a tool constructed in accordance with one embodiment of the invention.

Referring now to the figures and more particularly to FIG. 1, a first embodiment of a hand tool 10 constructed in accordance with the present invention is shown. The hand tool 10 generally comprises a functional tool end, hereafter the tool head 15, and one or more handles 20. As shown in FIG. 1, the hand tool 10 can be a wire cutter and stripper, wherein the head end 15 comprises first and second blade elements 11 and 13 rotatably coupled around a fastener 22. Each of the blade elements 11 and 13 comprises a conductive blade 18 and a handle 20. The blades 18 each include a cutting edge 23 for cutting a wire. Each cutting edge 23 includes a generally v-shaped or notched cutting edge 24 which, when the metal blades 18 are pivoted toward each other, provide cutting edges for stripping insulation from a wire. Each of the handles 20 may be an extension of the corresponding blades and is preferably covered with a plastic grip or other non-conductive covering material 26. A non-contact voltage alert circuit 12, which is housed in one of the handles and is coupled to one of the blade elements 11 and 13 through a resistor 14, provides an alert signal to the operator to indicate that the hand tool 10 is physically approaching an electrically live wire, as described below.

Protruding from the handle 20 is a momentary push button switch 16. The push button switch 16 is used to activate or power the non-contact voltage alert circuit 12, and to provide a path to the user's hand from the common ground of the non-contact voltage alert circuit 12. The switch 16 therefore ensures that current flow from a wire travels through resistor 14 and the non-contact voltage alert circuit 12, and not through another path.

Figure 2:
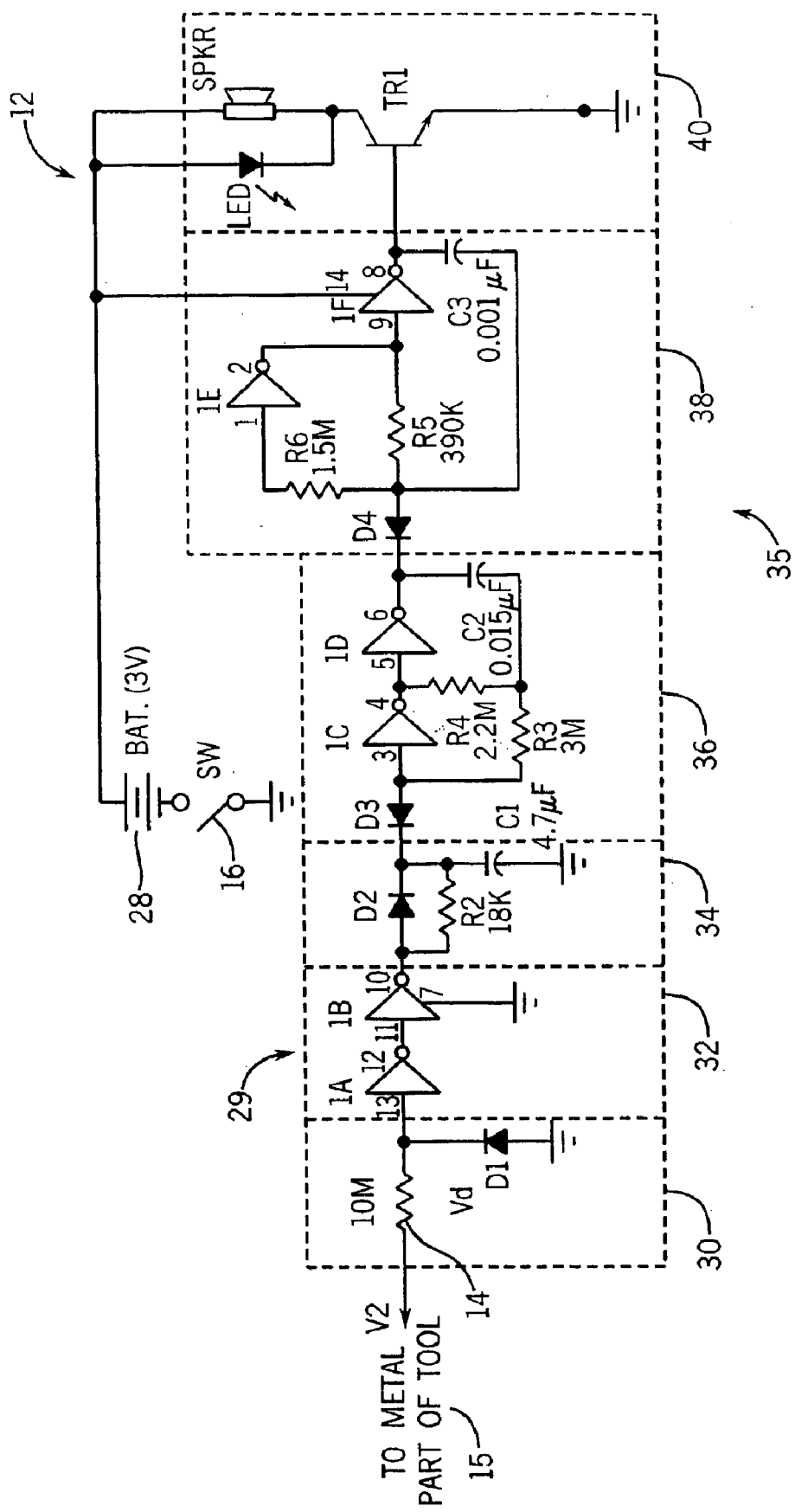
FIG. 2 is a circuit diagram of the voltage alert circuit of FIG. 1.

Referring now to FIG. 2, a circuit diagram of the non-contact voltage alert circuit 12 of FIG. 1 is shown. The non-contact voltage alert circuit 12 generally comprises a trigger circuit 29 for determining when the hand tool 10 is near an energized wire and an alarm circuit 35 for providing an indication to the user. In a preferred embodiment, the trigger circuit 29 comprises voltage divider 30; an inverter circuit 32 and a rectification circuit 34, while the alarm circuit 35 comprises a low frequency oscillator 36; a high frequency oscillator 38; and an alarm activation circuit 40. The voltage alert circuit 12 is activated by the switch 16 which applies power from the battery 28 to the circuit 12, as described above.

Referring still to FIG. 2, the trigger circuit 29 receives an input alternating current (AC) voltage, compares the input voltage to a threshold level and activates the alarm circuit 35 when the input exceeds a threshold value. The input voltage provides an indication that the hand tool 10 is near an energized wire as described below with reference to FIG. 5.

The first stage of the trigger circuit 29 is the voltage divider 30, comprising resistor 14 which receives an input voltage $V_2$ indicative of the proximity of the tool to a live wire, and a diode D1 coupled between the output of the resistor 14 and ground. The voltage divider 30 reduces the voltage $V_2$ to a level suitable for use in conjunction with the digital circuitry described below. As a function of the applied voltage $V_2$, the voltage across D1 varies from substantially zero when the hand tool 10 is not in proximity with a live electrical wire, to a threshold value of a few volts when the hand tool 10 is near a live wire, as described below. The value of the resistor 14 is selected to prevent excessive current flow through the non-contact voltage alert circuit 12 when the hand tool 10 touches a live wire, while also providing a relatively small voltage drop, but assuring that sufficient voltage is provided to activate the non-contact voltage alert circuit 12. For an expected input voltage provided by a wire operating in the range between 120 and 220 VAC, the resistor R1 typically has a value of 10 Mega Ohms.

The voltage across diode D1 provides an input signal to the inverter circuit 32, which comprises CMOS logic inverter gates 1A and 1B. The gate 1A switches between a logic high and a logic low state as the voltage across the diode D1 reaches a threshold value, typically in a range between one and two volts. As noted above, the voltage across D1 and, therefore, the input voltage to the inverter 1A varies with the distance between the hand tool 10 and a live electrical wire. When the hand tool 10 is not near a live wire, the voltage across diode D1 is substantially zero and therefore below the threshold voltage. In this state, the output of inverter gate 1A will be high because of the inverting action of the logic gate. When the hand tool 10 is placed near a live wire with a voltage impressed on it, the voltage across D1 rises above the threshold voltage to trip the inverter 1A causing the output of inverter 1A to go low. A logic low output from inverter 1A therefore indicates that a voltage is being sensed by the hand tool 10. The second inverter, 1B, buffers and inverts the signal, thereby providing a logic high output signal from the inverter circuit 34 when the tool 10 is near a live wire.

The output of inverter 1B is received by the rectifying circuit 34, which converts the alternating voltage signal to a direct current (DC) voltage using a typical rectifying circuit comprising diode D2, resistor R2, and capacitor C1. The rectifying circuit 34 provides a DC voltage across capacitor C1, therefore, only when the hand tool 10 is near an energized live wire.

The output of the rectifying circuit 34 is received by the alarm circuit 35, which provides a visual or audio signal to the user, as described below. In a preferred embodiment of the invention, the alarm circuit comprises low and high frequency oscillator circuits 36 and 38.

The low frequency oscillator circuit 36 comprises logic inverters 1C and 1D, along with associated components D3, R3, R4, and C2. The low frequency oscillator circuit 36 is activated or enabled when a DC voltage is present on capacitor C1. When activated, the low frequency oscillator produces an output signal having a frequency in the range of 1 to 5 Hertz.

The output signal of the low frequency circuit 36 enables the high frequency oscillator 38, comprising logic inverters 1E and 1F and the associated components R6, D4, R5, and C3. The high frequency oscillator 38 produces an output signal in an audio frequency range. The output of the oscillator 38 drives the alarm activation circuit 40 by activating transistor TR1, which in turn is connected to a speaker SPKR and an LED. Hence, when the hand tool 10 is placed near an energized WIRE, the LED is activated and the speaker will produce a sound in the audio range produced by the oscillator 38.

Although the alarm circuit 35 has been described to include oscillators 36 and 38, a number of different alarm circuits can be constructed to provide similar functions. For example, if only a visual indicator such as the LED is used, a transistor switch to an LED can be used. Other alarm circuits will be apparent to those of ordinary skill in the art.

As noted above, the battery 28, which preferably provides a 3V DC power supply, powers the circuit. The negative terminal of the battery 28 is connected to circuit common or ground through the switch 16 and, therefore, the switch 16 must be activated to energize the circuit. When the user's hand pushes switch 16, it energizes the alert circuit 12, thereby enabling the alarm circuit 35 to be activated. As noted above, the switch 16 also provides an electrical path from the circuit common or ground to the user's body and through the user down to the ground.

Figure 3:
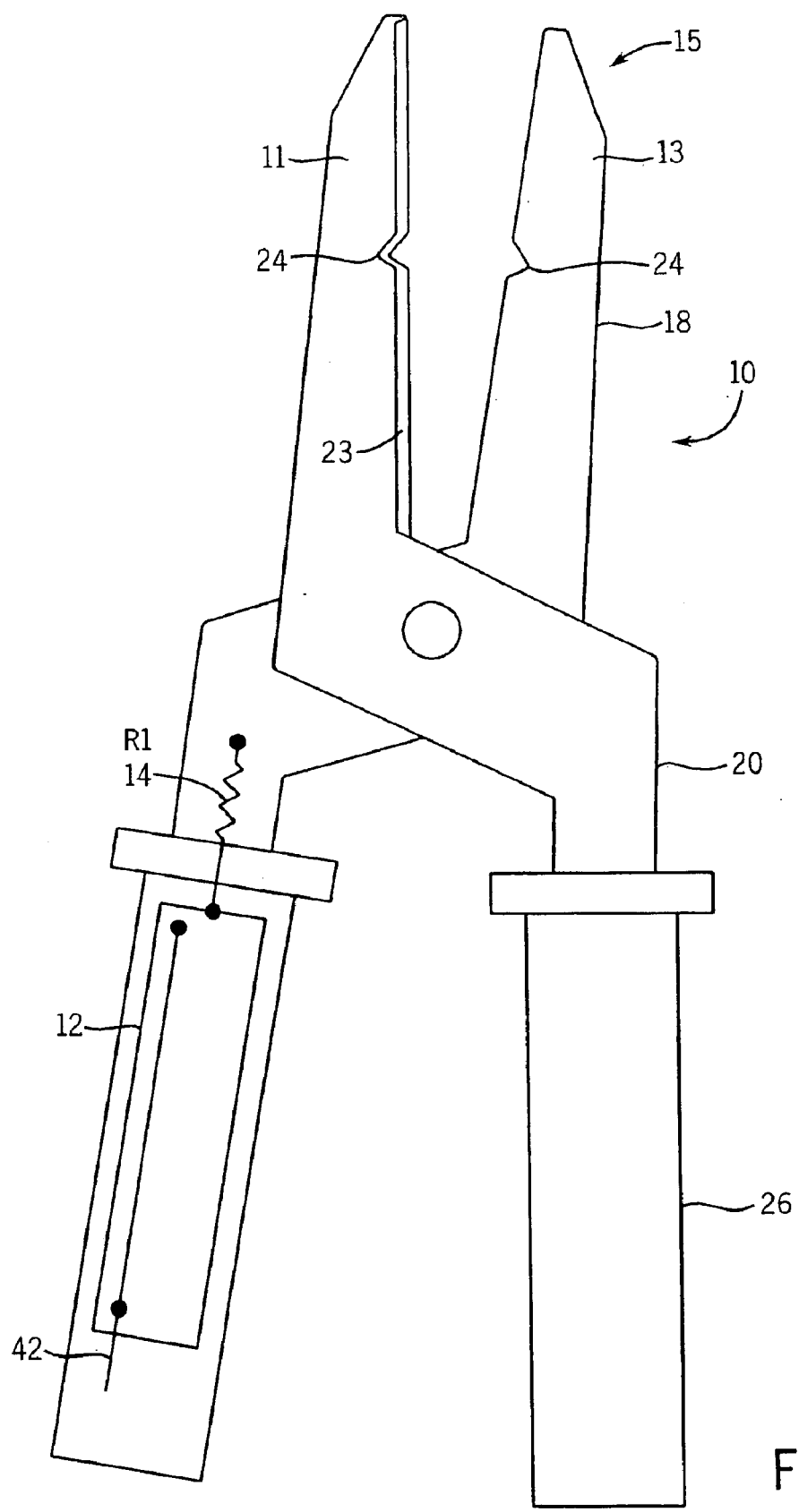
FIG. 3 is a schematic plan view of a tool constructed in accordance with a second embodiment of the invention.
Figure 4:
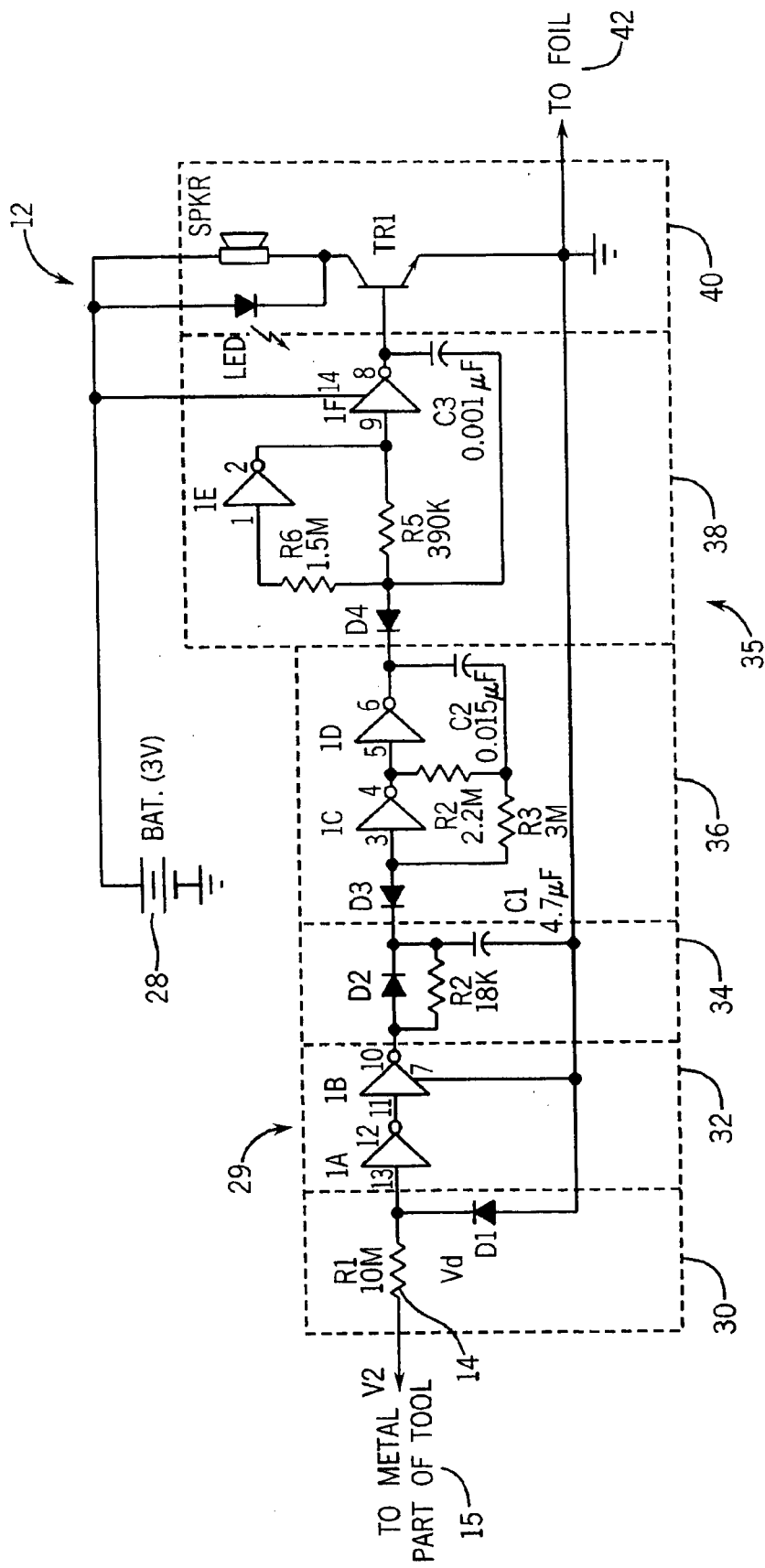
FIG. 4 is a circuit diagram of the voltage alert circuit of FIG. 3.

Referring now to FIG. 3, a second embodiment of a hand tool 10 constructed in accordance with the present invention is shown. Again the hand tool 10 is a wire stripper wherein like elements to those of FIG. 1 are numbered in accordance with the description of FIG. 1. The hand tool 10 of FIG. 3, however, does not include the push button 16 described above but rather includes a metal foil 42 inside the plastic covered handle 26. Referring now also to FIG. 4, a circuit diagram of the hand tool of FIG. 3 is shown, wherein elements are numbered in accordance with the description of FIG. 2, above. It can be seen that the metal foil 42 is coupled to the circuit common or ground of the voltage alert circuit 12. The metal foil 42 provides capacitive coupling to a user's hand and a conductive path for electrical current induced in the hand tool 10, thereby insuring that the current flow from the live electrical wire is through resistor 14 and the voltage alert circuit 12 and not via another path. As noted above, in this application there is no switch 16. Therefore, the circuit 12 is constantly energized. In this application, therefore, low powered CMOS devices are used, thereby allowing the battery to last a long time.

Figure 5:
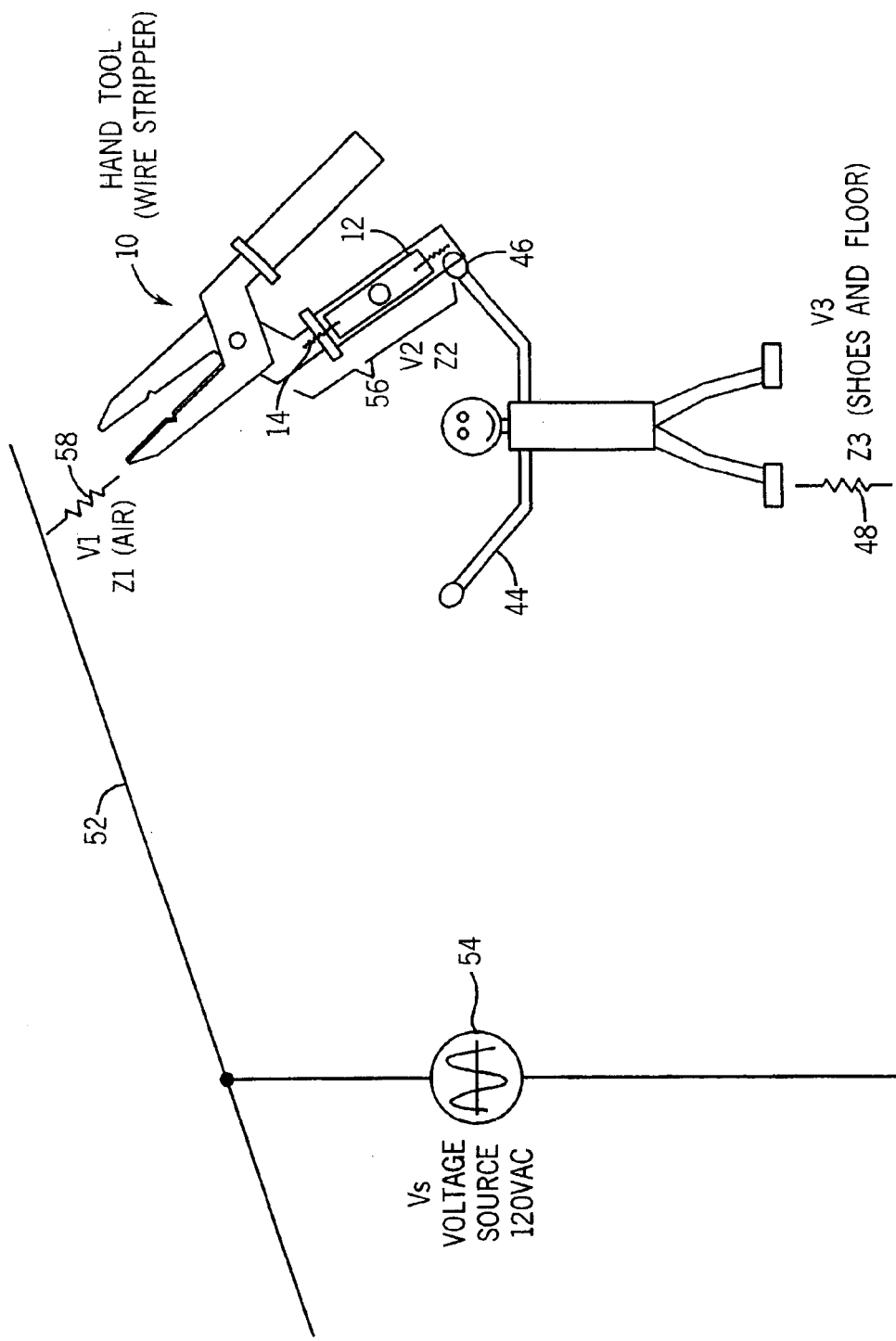
FIG. 5 is a circuit diagram illustrating the use of the tools of FIGS. 1 and 3

Referring now to FIG. 5, in operation a user 44 grips the handles 20 of the hand tool 10 in a hand 46 to cut or strip insulation from a wire 52. The wire 52 is electrically coupled to a voltage source 54 provided between the wire 52 and ground 50. The voltage source 54 is typical of those encountered in home or business electrical wiring, and can be, for example, a voltage supply operating in the range of 120 or 220 volts AC at either 50 or 60 Hertz, or in various other voltage source configurations used in electrical supply configurations. As the hand tool 10 approaches the energized wire, the user 44 is coupled to the energized wire 52 through a first impedance 58 caused by the air gap between the energized wire 52 and a second impedance 56 from the resistor 14 and voltage alert circuitry 12 in the insulated handle of the tool. The user 44 is further coupled to ground 50 through an impedance 48 comprising generally an impedance from the shoes of the user 44 and the floor of the installation environment. Therefore, a complete circuit exists from the power source 54, through the wire 52, through the air to the tool 10, from the tool 10 to the user 44 and through the user 44 to ground 50, which is the ground of the voltage source 54.

Based on Kirchoff's law, which states that the sum of the voltage rises (sources) must equal the sum of the voltage drops around a closed loop circuit, the voltage drops across the impedances 48 (V3), 56 (V2), and 58 (V1) add to be substantially equivalent to that of the voltage source 54 (Vs), such that Vs=V1+V2+V3. Here, the voltage drop across the body of the user 44 is neglected, as the impedance of the human body is comparatively very low. It should be clear from FIG. 5 that the impedances 58, 56, and 48 and the associated voltage drops V1, V2, and V3 can vary widely as the hand tool 10 is moved about in the vicinity of the wire 52.

If the hand tool 10 is far from the wire 52, the voltage V1 is substantially equivalent to that of the voltage source 54 because the impedance 58 of the air gap is much larger than that of the other impedances. As the hand tool 10 is moved closer to the wire 52, the impedance 58 becomes smaller and current begins to flow in the circuit. If the impedance 56 across the hand tool 10 is large, a voltage drop V2 will occur. As the voltage drop V2 rises above a threshold level, the trigger circuit 29 of the non-contact voltage alert circuit 12 will be activated as described above, thereby causing visual and/or audible signals to be provided to the user 44.

If the hand tool 10 touches the wire 52, V1 becomes small and most of the voltage 54 is across the hand tool impedance 56 and floor impedance 48. To prevent a hazard to the user 44 under such circumstances, the impedance 56 of the hand tool 10, and particularly resistor 14, is selected to prevent a large current flow, as described above.

Figure 6:
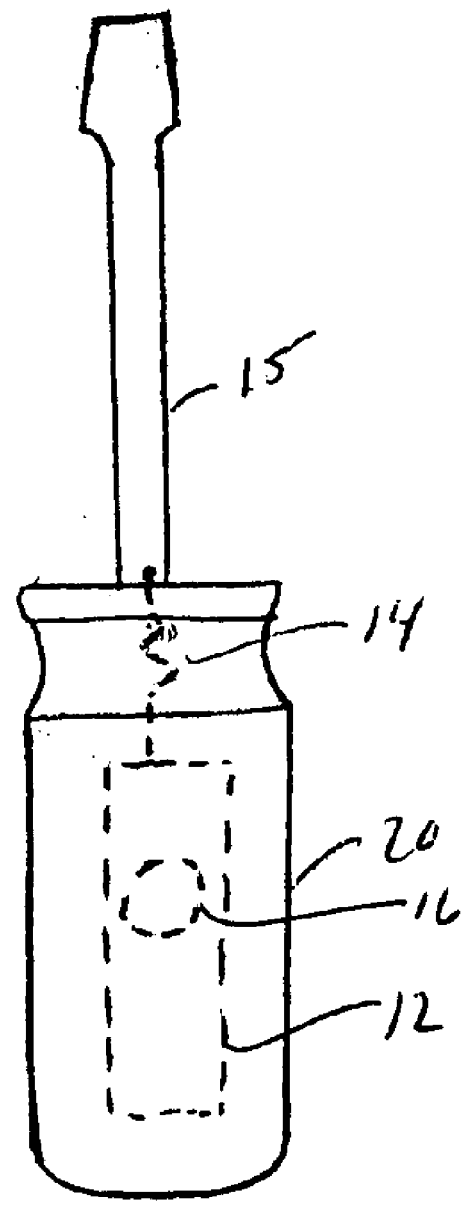
FIG. 6 is a plan view of a screw driver constructed in accordance with the invention.
Figure 7:
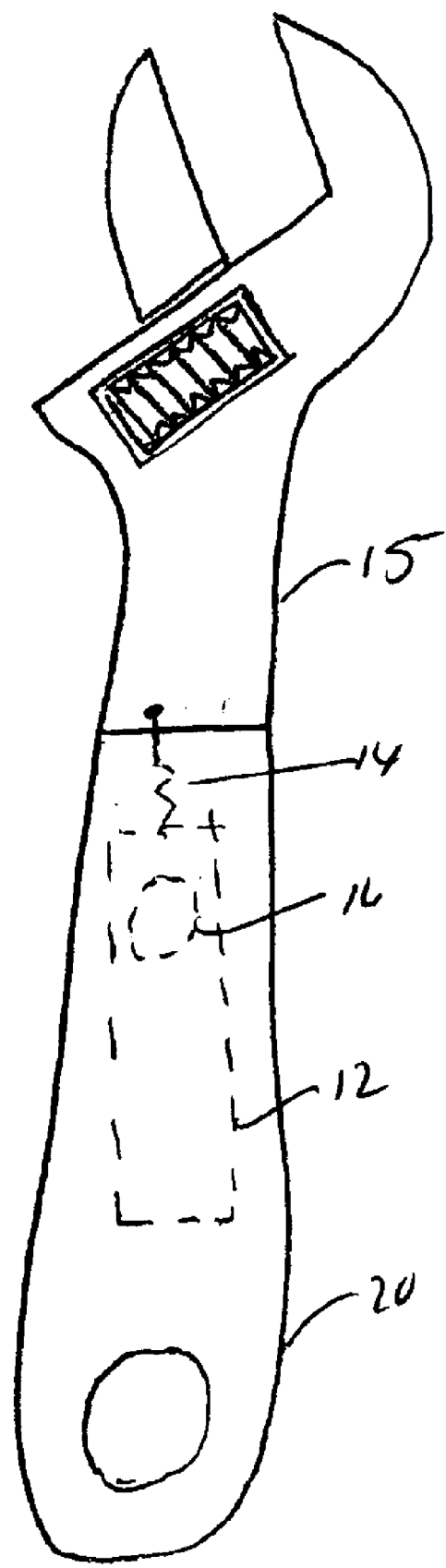
FIG. 7 is a plan view of a wrench constructed in accordance with the present invention.
Figure 8:
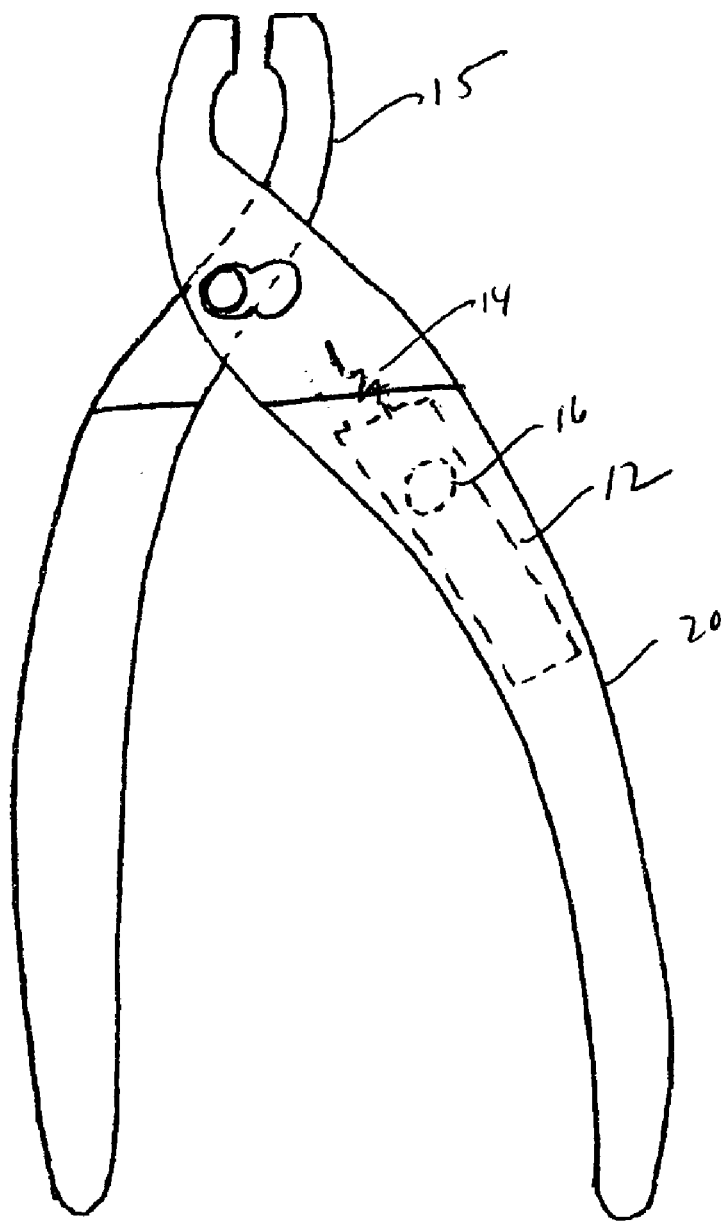
FIG. 8 is a plan view of the pliers constructed in accordance with the present invention.

Although the hand tool 10 has been described as a wire cutter and stripper, other types of hand tools including pliers (FIG. 8), screw drivers (FIG. 6), wrenches (FIG. 7), wire cutter, wire stripper, and other tools can be provided with an alert circuit 12. In each of these applications, the tool head 15 is designed to provide the expected function. For example, in a screw driver (FIG. 6) the tool head 15 can comprise a straight blade or Phillips head screw driver. In a pliers (FIG. 8), the tool head 15 comprises two pivoted arms. Other tool heads will be apparent to those of ordinary skill in the art. Furthermore, although, the wire 52 has been described as an insulated wire, the wire 52 can also be a bare wire, without requiring a change to the sensing circuit. Additionally, although specific embodiments of the non-contact voltage alert circuit 12 have been described, it will be apparent that various types of alert and alarm circuitry can be employed.

Although preferred embodiments have been shown and described, it will be apparent to one of ordinary skill in the art that a number of modifications could be made to the method and apparatus described without departing from the scope of the invention. It should be understood, therefore, that the methods and apparatuses described above are only illustrative and do not limit the scope of the invention, and that various modifications could be made by those skilled in the art that would fall within the scope of the invention.

What is claimed is:

1. A hand tool, comprising:
   conductive tool head that is at least one of a wire cutter, a wire stripper, a screw driver, a wrench, and a pliers;
   a non-contact voltage sensing circuit electrically connected to the conductive tool head, the non-contact voltage sensing circuit including a comparator for comparing a voltage sensed at the conductive tool head to a threshold voltage level and an alarm circuit for generating a human perceptible alarm signal when the threshold voltage level is exceeded, the alarm circuit including at least one of a visual and an audio indicator device electrically connected to receive the alarm signal and to provide an output that is perceptible by a human; and
   a handle operatively connected to the tool head and housing the non-contact voltage sensing circuit including the at least one indicator, the indicator providing a human perceptible signal to a user indicating that the tool head is in proximity to a live electrical wire.

2. The hand tool as defined in claim 1, further comprising an actuator for selectively activating the non-contact voltage sensing circuit.

3. The hand tool as defined in claim 1, wherein the handle comprises an insulated material.

4. The hand tool as defined in claim 3, wherein the handle further comprises a metal foil coupled to a circuit common in the non-contact voltage sensing circuit.

5. The hand tool as defined in claim 1, further comprising a momentary actuator switch coupled to the handle, the momentary actuator switch being coupled between a power supply and the non-contact voltage sensing circuit to activate the non-contact voltage sensing circuit.

6. A hand tool comprising:
   a) a conductive tool head that is at least one of a wire cutter, a wire stripper, a screw driver, a wrench and a pliers to work a work piece;
   b) a handle, connected to the tool head so as to operate the tool head to work the work piece;
   c) a non-contact voltage sensing circuit electrically coupled to the conductive tool head; and d) an alarm device, the alarm device being activated by the non-contact voltage sensing circuit to provide a signal to indicate that the tool head is in an electrical field at an elevated voltage.

7. A hand tool as defined in claim 6, wherein the alarm device comprises at least one of a visible alert indicator and an audible alert indicator.

8. A hand tool as defined in claim 7, wherein the alarm device comprises a light emitting diode.

9. A hand tool as defined in claim 7, wherein the non-contact voltage alert circuit comprises an oscillator for driving the audible alert indicator in an audio frequency range.

10. A hand tool as defined in claim 6, further comprising a switch for activating the non-contact voltage sensing circuit.

11. A hand tool as defined in claim 6, further comprising a conductive foil, the conductive foil being coupled to a circuit common of the non-contact voltage sensing circuit and capacitively coupled to the user's hand to provide a connection through the user to provide a ground for the circuit.

12. A hand tool as defined in claim 6, wherein the non-contact voltage detection circuit is housed in the handle.

* * * * *